(12) United States Patent
Kang et al.

(10) Patent No.: US 9,378,951 B1
(45) Date of Patent: Jun. 28, 2016

(54) LASER ANNEALING APPARATUS AND METHOD OF MANUFACTURING DISPLAY APPARATUS USING THE SAME

(71) Applicant: SAMSUNG DISPLAY CO., LTD., Yongin-si, Gyeonggi-do (KR)

(72) Inventors: Sunmi Kang, Yongin-si (KR); Kyongho Park, Yongin-si (KR); Raechul Park, Yongin-si (KR); Donghoon Shin, Yongin-si (KR); Kwanghyun You, Yongin-si (KR); Hongro Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/831,802

(22) Filed: Aug. 20, 2015

(30) Foreign Application Priority Data

Feb. 9, 2015 (KR) ........................ 10-2015-0019665

(51) Int. Cl.
*H01L 21/36* (2006.01)
*H01L 21/02* (2006.01)

(52) U.S. Cl.
CPC .... *H01L 21/02675* (2013.01); *H01L 21/02532* (2013.01); *H01L 21/02592* (2013.01)

(58) Field of Classification Search
CPC .. B23K 26/147; B23K 26/702; B23K 26/362; H01L 21/268; H01L 21/76254; H01L 21/1266
USPC ........................................................ 438/487
See application file for complete search history.

(56) References Cited

U.S. PATENT DOCUMENTS

| 6,071,796 A * | 6/2000 | Voutsas ............... H01L 21/2026 257/E21.134 |
| 2003/0068872 A1 | 4/2003 | Kusumoto et al. |
| 2004/0099220 A1* | 5/2004 | Tsao ....................... C23C 16/56 118/729 |
| 2009/0181552 A1* | 7/2009 | Shimomura ........... B23K 26/08 438/795 |

FOREIGN PATENT DOCUMENTS

| JP | 9-139355 A | 5/1997 |
| KR | 10-0386202 B1 | 6/2003 |
| KR | 10-2004-0031276 A | 4/2004 |
| KR | 10-2008-0056524 A | 6/2008 |
| KR | 10-2011-0003159 A | 1/2011 |
| KR | 10-2012-0006864 A | 1/2012 |

* cited by examiner

*Primary Examiner* — Trung Q Dang
(74) *Attorney, Agent, or Firm* — Lewis Roca Rothgerber Christie LLP

(57) ABSTRACT

A method of manufacturing a display apparatus, the method including forming an amorphous silicon layer on a substrate, placing the substrate with the amorphous silicon layer in a chamber having a window on an upper portion thereof, and directing a laser beam toward the window, and converting the amorphous silicon layer into a polycrystalline silicon layer by irradiating the amorphous silicon layer with the laser beam while nitrogen gas is discharged from a nozzle located adjacent to an opening of a stabilizing room, wherein the laser beam reaches the amorphous silicon layer on the substrate after passing through the window, the stabilization room, and the opening of the stabilization room, wherein the opening faces the substrate.

5 Claims, 3 Drawing Sheets

LASER ANNEALING APPARATUS AND METHOD OF MANUFACTURING DISPLAY APPARATUS USING THE SAME

CROSS-REFERENCE TO RELATED APPLICATION

This application claims priority to and the benefit of Korean Patent Application No. 10-2015-0019665, filed on Feb. 9, 2015, in the Korean Intellectual Property Office, the disclosure of which is incorporated herein in its entirety by reference.

BACKGROUND

1. Field

One or more exemplary embodiments relate to a laser annealing apparatus and a method of manufacturing a display apparatus using the same.

2. Description of the Related Art

An organic light-emitting display apparatus or a liquid display apparatus generally controls whether or not each pixel emits light and the level of emission intensity by using a thin film transistor. The thin film transistor includes a semiconductor layer, a gate electrode, source and drain electrodes, and polycrystalline silicon, which is obtained by patterning amorphous silicon and is generally used as the semiconductor layer.

An amorphous silicon layer is formed on a substrate and converted into polycrystalline silicon by a crystallization process to manufacture a thin film transistor substrate or a display apparatus including the same.

However, high-quality polycrystalline silicon is not easily formed by the crystallization process of conventional methods. In detail, grains are created when converting the amorphous silicon into the polycrystalline silicon, and hillocks protruding outwardly from grain boundaries and having a substantial height was also formed. In this regard, the high-quality polycrystalline silicon is not easily formed.

SUMMARY

Aspects of one or more exemplary embodiments of the present invention are directed to a laser annealing apparatus for discharging a laser beam in a uniform manner and for forming high-quality polycrystalline silicon layer and a method of manufacturing a display apparatus using the same.

Additional aspects will be set forth in part in the description which follows and, in part, will be apparent from the description, or may be learned by practice of the presented embodiments.

According to one or more exemplary embodiments, there is provided a method of manufacturing a display apparatus, the method including: forming an amorphous silicon layer on a substrate; placing the substrate with the amorphous silicon layer in a chamber having a window on an upper portion thereof, and directing a laser beam toward the window; and converting the amorphous silicon layer into a polycrystalline silicon layer by irradiating the amorphous silicon layer with the laser beam while nitrogen gas is discharged from a nozzle located adjacent to an opening of a stabilizing room, wherein the laser beam reaches the amorphous silicon layer on the substrate after passing through the window, the stabilization room, and the opening of the stabilization room, wherein the opening faces the substrate.

In an embodiment, a second end of a first supply line having a first end connected to the nozzle is connected to a first side of a middle tank, a second supply line is connected to a second side of the middle tank, and a part of the middle tank connected to the first supply line and a part of the middle tank connected to the second supply line do not face each other.

In an embodiment, the nitrogen gas is discharged from the nozzle after passing through an additional supply line, the additional supply line being divaricated from the first supply line at a portion of the first supply line between the first end and the second end, the additional supply line being connected to the first side of the middle tank.

In an embodiment, the nitrogen gas is discharged from the nozzle after passing through the second supply line, the middle tank, and the first supply line.

In an embodiment, the nitrogen gas is discharged from the nozzle after passing through a diffuser between the first supply line and the middle tank In an embodiment, inside corners of the middle tank are rounded.

In an embodiment, the first supply line is bent one or more times.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
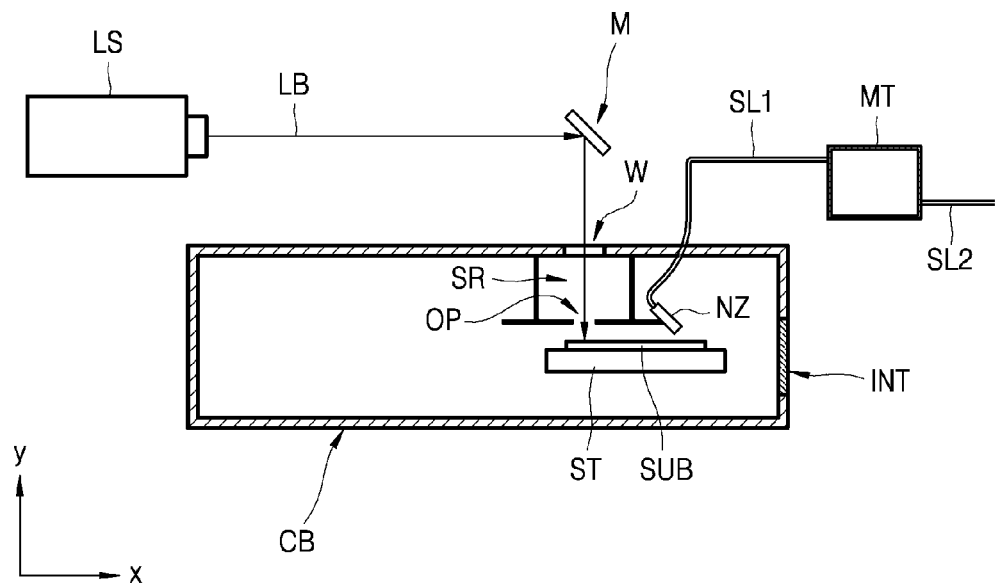
FIG. 1 is a schematic view of a laser annealing apparatus according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

Hereinafter, the inventive concept will be described more fully with reference to the accompanying drawings, in which exemplary embodiments of the inventive concept are shown. This inventive concept may, however, be embodied in many different forms and should not be construed as being limited to the exemplary embodiments set forth herein.

Hereinafter, the inventive concept will be described in detail by explaining preferred embodiments of the inventive concept with reference to the attached drawings. Like reference numerals in the drawings denote like elements and the descriptions thereof may not be repeated.

Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 illustrates a schematic view of a laser annealing apparatus according to an exemplary embodiment. As illustrated in FIG. 1, the laser annealing apparatus according to an exemplary embodiment includes a chamber CB, a stage ST, a stabilizing room SR, a nozzle NZ, a first supply line SL1, a middle tank MT, and a second supply line SL2.

The chamber CB may be defined as a space in which an amorphous silicon layer on a substrate SUB placed therein may be irradiated with a laser beam. The substrate SUB may be inserted into the chamber CB via a substrate insert INT located in a wall of the chamber CB in +x direction. The laser beam LB may enter the chamber CB through a window W located in an upper wall of the chamber CB in +y direction, and reach at the amorphous silicon layer on the substrate SUB. The chamber CB may include a substrate exit via which the substrate SUB may be removed once laser beam annealing is complete. In some embodiments, the substrate may be removed via the substrate insert INT.

The stage ST is placed in the chamber CB and the substrate SUB having the amorphous silicon layer thereon may be placed on the stage ST. For example, the substrate SUB having the amorphous silicon layer thereon may be placed on an end effector of a transfer robot and then, the end effector moves from outside of the chamber CB to inside of the chamber CB through the substrate insert INT, a plurality of pins passing through the stage ST move up in a +y direction to support the substrate SUB having the amorphous silicon layer thereon, and the end effector moves from the inside of the chamber CB to the outside of the chamber CB through the substrate insert INT. Then, the pins move down in a −y direction so that the substrate SUB having the amorphous silicon layer thereon may be placed on the stage ST. The substrate SUB having the amorphous silicon layer thereon may be placed on the stage ST in various methods including the aforementioned method, and the stage ST may move to change a position of the substrate SUB in the chamber CB.

When the substrate SUB having the amorphous silicon layer thereon is placed on the stage ST, the laser beam LB is emitted from a laser source LS and directed toward the window W of the chamber CB by using a mirror M or the like, and after passing through the window W, the laser beam LB reaches the amorphous silicon layer on the substrate SUB. The laser beam LB emitted from the laser source LS may pass through the window W of the chamber CB after passing through an optical system such as a homogenizer and a lens.

Here, the laser beam LB that passed through the window W passes through the stabilizing room SR before reaching at the substrate SUB on the stage ST. The stabilizing room SR is placed in the chamber CB and an upper portion of the stabilizing room SR may correspond to the window W of the chamber CB, as illustrated in FIG. 1. Also, the stabilizing room SR has an opening OP in a lower portion facing the stage ST so that the laser beam LB passes through the opening OP to reach the amorphous silicon layer on the substrate SUB.

The stabilizing room SR may be filled with gas supplied from a gas supplier. Because the stabilizing room SR has the opening OP, the gas supplied from the gas supplier to the stabilizing room SR may be discharged toward the stage ST (approximately in the −y direction) through the opening OP. The gas may be nitrogen gas, but is not limited thereto.

When converting amorphous silicon into polycrystalline silicon by irradiating the amorphous silicon layer with a laser beam, grains are formed and thus, hillocks protruding outwardly from grain boundaries may be formed. During the crystallization process, the hillocks may increase in height as the concentration of oxygen around the amorphous silicon layer increases. When the height of the hillocks is high, some portions of the hillocks may not be covered by an insulating layer even though the insulating layer is formed on the crystallized polycrystalline silicon layer. In this regard, defects may occur during a manufacturing process for a thin film transistor or the like. However, the laser annealing apparatus according to an exemplary embodiment expels the gas supplied into the stabilizing room SR to the stage ST (approximately in the −y direction) through the opening OP through which the laser beam LB passes. In this regard, the concentration of oxygen around the amorphous silicon layer where the laser beam LB is radiated may be dramatically decreased. As a result, the formation of hillocks during the crystallization process may be suppressed, or, even when hillocks is formed, the height thereof may be low enough to be covered by the insulating layer.

To achieve the aforementioned result, the concentration of oxygen around the amorphous silicon layer to be irradiated with the laser beam LB should be dramatically decreased. To this end, a large amount of nitrogen gas may be discharged from inside of the stabilizing room SR toward (or onto) the amorphous silicon layer on the substrate SUB through the opening OP.

However, when an amount of nitrogen gas discharged from inside of the stabilizing room SR toward the amorphous silicon layer on the substrate SUB through the opening OP is increased, a flow of nitrogen gas discharged from the opening OP may be highly unstable and inconsistent. As described above, the laser beam LB for crystallizing the amorphous silicon layer also passes through the opening OP and then reaches the amorphous silicon layer. Therefore, when the flow of nitrogen gas discharged from the opening OP is unstable and inconsistent, the resulting path traveled by the laser beam LB passing through the opening OP may be different from the preset or predetermined path, thereby reducing or preventing high-quality crystallization. In this regard, it may be difficult to continuously increase the amount of nitrogen gas discharged from the inside of the stabilizing room SR toward the amorphous silicon layer on the substrate SUB through the opening OP.

However, the laser annealing apparatus according to the exemplary embodiment uses an independent nozzle NZ to discharge nitrogen gas onto the amorphous silicon layer on the substrate SUB and thus, even when the amount of nitrogen gas discharged from the inside of the stabilizing room SR toward the amorphous silicon layer on the substrate SUB through the opening OP is not sufficiently large, a high-quality crystallization may be achieved.

As described above, the stage ST may change the position of the substrate SUB within the chamber CB. In detail, the stage ST may change the position of the substrate SUB within the chamber CB during the crystallization of the amorphous silicon layer using the laser beam LB. Because an opening of the stabilizing room SR is extended in a +z direction and the laser beam LB is shaped as a line beam extended in the +z direction, the stage ST changes the position of the substrate SUB to crystallize the amorphous silicon layer on the whole surface of the substrate SUB. Referring to FIG. 1, the stage ST may move in a −x direction to change the relative position of the substrate SUB with respect to the laser beam LB. Here, the nozzle NZ is placed adjacent to the opening OP of the stabilizing room SR and in the +x direction of the opening OP, and may discharge nitrogen gas toward the amorphous silicon layer right before the laser beam LB reaches the amorphous silicon layer on the substrate SUB.

As described above, the concentration of oxygen around an area of the amorphous silicon layer on the substrate SUB becomes dramatically lowered right before the laser beam LB is radiated toward the area by using the nozzle NZ, and thus, high-quality crystallization may be performed even when the amount of the nitrogen gas discharged from the inside of the stabilizing room SR toward the amorphous silicon layer on the substrate SUB through the opening OP is not sufficiently large. In other words, by discharging nitrogen from the nozzle NZ, the concentration of oxygen around an area of the amorphous silicon layer may be reduced immediately before the laser beam LB reaches the area of the amorphous silicon layer on the substrate SUB, and thus the formation of hillocks may be suppressed, or, even when hillocks are formed, the height thereof may be low enough to be covered by an insulating layer.

Although a nitrogen atmosphere is maintained inside of the chamber CB, which is different from the air atmosphere outside of the chamber CB, oxygen may enter (e.g., be flowed into) the inside of the chamber while inserting the substrate SUB through the insert INT. The oxygen may be removed (or discharged) to the outside of the chamber CB by using a pump included in the chamber CB, but the oxygen may not be completely discharged to cause the formation of the hillocks during the laser beam annealing process. However, the laser annealing apparatus according to the exemplary embodiment supplies the nitrogen gas through the opening OP of the stabilizing room SR and through the nozzle NZ, and thus, the formation of the hillocks may be effectively suppressed or the height of the hillocks may be dramatically lowered when the hillocks are formed.

For example, regarding the substrate SUB moved from the outside of the chamber CB to the inside of the chamber CB, the amount of oxygen around the amorphous silicon layer on the substrate SUB is likely to be high. In this regard, the nitrogen gas is supplied through the nozzle NZ to dramatically lower the concentration of oxygen around an area of the amorphous silicon layer right before the laser beam LB is radiated toward the area, thereby processing the high-quality crystallization.

In this case, by discharging the nitrogen gas from the nozzle NZ to remove the oxygen around the area of the amorphous silicon layer, it is desired for the oxygen to flow in a direction away from the opening OP of the stabilizing room SR. Because the laser beam LB is radiated toward the amorphous silicon layer through the opening OP, it is desirable that the concentration of oxygen around the opening OP be decreased. Accordingly, as illustrated in FIG. 1, the nozzle NZ supplied the nitrogen gas in the −y direction, and may be tilted in the +x direction to the substrate insert INT, not in the −x direction to the stabilizing room SR.

As described above, the laser beam LB is line shaped and travels in the +x direction, and the nozzle NZ may be formed to be linearly extended in the +z direction. Alternatively, a plurality of nozzles NZ may be linearly aligned in the +z direction.

The nitrogen gas discharged from the nozzle NZ is supplied to the nozzle NZ through the first supply line SL1. A first end of the first supply line SL1 is connected to the nozzle NZ. The other end of the first supply line SL1, i.e., a second end of the first supply line SL1 is, as illustrated in FIG. 1, connected to a first side of the middle tank MT. The first side of the middle tank MT is located in the −x direction from the center of the middle tank MT. The second supply line SL2 is connected to the other side (i.e., a second side) of the middle tank MT. The second side of the middle tank MT is located in the +x direction from the center of the middle tank MT. In other words, the nitrogen gas is supplied to the middle tank MT through the second supply line SL2, and the nitrogen gas in the middle tank MT is discharged toward the amorphous silicon layer on the substrate SUB through the first supply line SL1 and the nozzle NZ.

In this case, it is desired to keep the amount of the nitrogen gas discharged from the nozzle NZ toward the amorphous silicon layer on the substrate SUB constant even with various external factors. When the amount of the nitrogen gas discharged from the nozzle NZ is not constant, the concentration of oxygen around the amorphous silicon layer is not constant, and thus the polycrystalline silicon layer resulting from the crystallization process may not be homogeneous. When a pixel circuit consisting of a plurality of pixels is formed by using the polycrystalline silicon layer, electrical characteristics of the pixels are not consistent with one another and thus, a final product formed therefrom, that is, a display apparatus, may be unable to display a high-quality image.

Accordingly, in order to reduce or prevent the aforementioned problem, the part of the middle tank MT connected to the first supply line SL1 and the part of the middle tank MT connected to the second supply line SL2 may not face each other in the laser annealing apparatus according to the exemplary embodiment. As an example, in FIG. 1, the part of the middle tank MT connected to the first supply line SL1 is placed to be higher in the +y direction than the part of the middle tank MT connected to the second supply line SL2.

In an embodiment, the part of the middle tank MT connected to the first supply line SL1 and the part of the middle tank MT connected to the second supply line SL2 face each other. That is, a height of the part of the middle tank MT connected to the first supply line SL1, measured in the +y direction from a bottom surface of the middle tank MT, is the same as the height of the part of the middle tank MT connected to the second supply line SL2, measured in the +y direction from the bottom surface of the middle tank MT. Here, a distance from a surface of the middle tank MT in an xy plane to the part of the middle tank MT connected to the first supply line SL1 is also the same as the distance from the surface of the middle tank MT in the xy plane to the part of the middle tank MT connected to the second supply line SL2.

When the two parts connected to the first and the second supply lines SL1 and SL2 do not face each other, in the laser annealing apparatus according to the exemplary embodiment, the nitrogen gas supplied into the inside of the middle tank MT through the second supply line SL2 does not flow directly into the first supply line SL1 after crossing the middle tank MT. The nitrogen gas circulates in at least some inner portions of the middle tank MT and then flows into the first supply line SL1. In this regard, the middle tank MT serves as a buffer for the nitrogen gas, and thus, even when a pump for supplying the nitrogen gas to the middle tank MT through the second supply line SL2 temporally operates abnormally, unintended fluctuations in the amount of the nitrogen gas discharged from the nozzle NZ after passing the first supply line SL1 may be reduced or effectively prevented.

Figure 2:
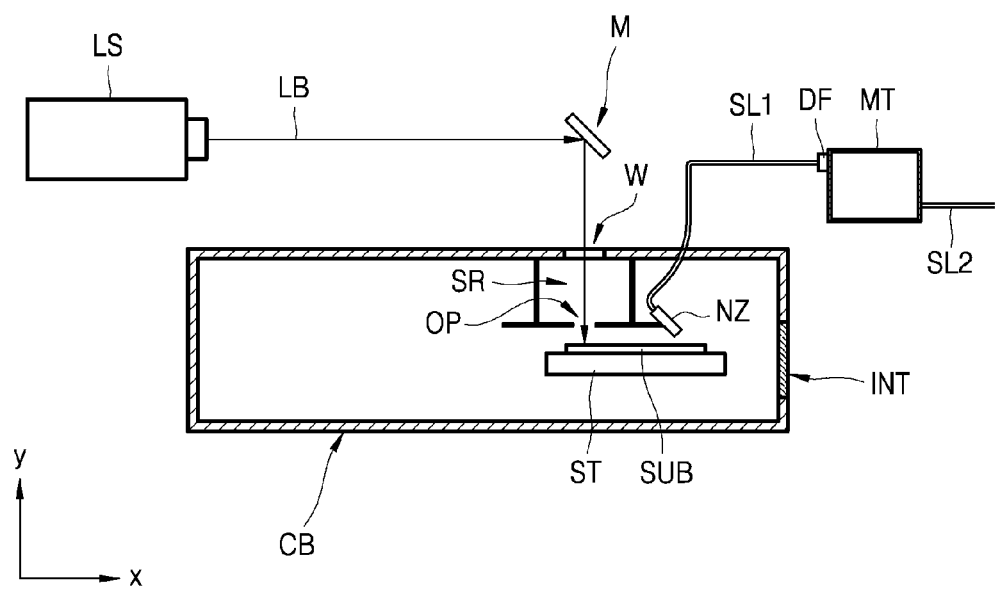
FIG. 2 is a schematic view of the laser annealing apparatus according to another exemplary embodiment.

In order to stabilize the amount of the nitrogen gas discharged from the nozzle NZ, as illustrated in FIG. 2, the laser annealing apparatus according to another exemplary embodiment may include a diffuser DF between the first supply line SL1 and the middle tank MT. The diffuser DF may be a sprayer and may stabilize the amount of the nitrogen gas supplied from the middle tank MT to the first supply line SL1, thereby stabilizing the amount of the nitrogen gas discharged from the nozzle NZ.

Figure 3:
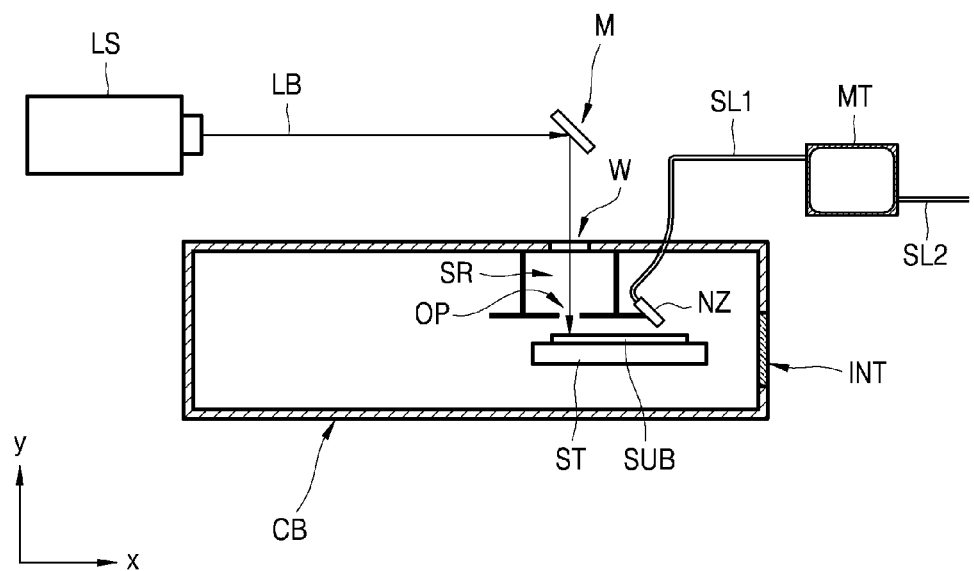
FIG. 3 is a schematic view of the laser annealing apparatus according to another exemplary embodiment.

FIG. 3 illustrates a schematic view of the laser annealing apparatus according to another exemplary embodiment. Referring to the laser annealing apparatus in FIG. 3, inside corners of the middle tank MT may be rounded. When an inside corner of the middle tank MT is at a sharp angle rather than rounded, turbulence of the nitrogen gas may result or the flow of the nitrogen gas may be unstable, which may cause the amount of the nitrogen gas discharged from the nozzle NZ after passing the first supply line SL1 to be unstable. However, as illustrated in FIG. 3, when the inside corner of the middle tank MT is rounded, the amount of the nitrogen gas discharged from the nozzle NZ may remain stable.

Figure 4:
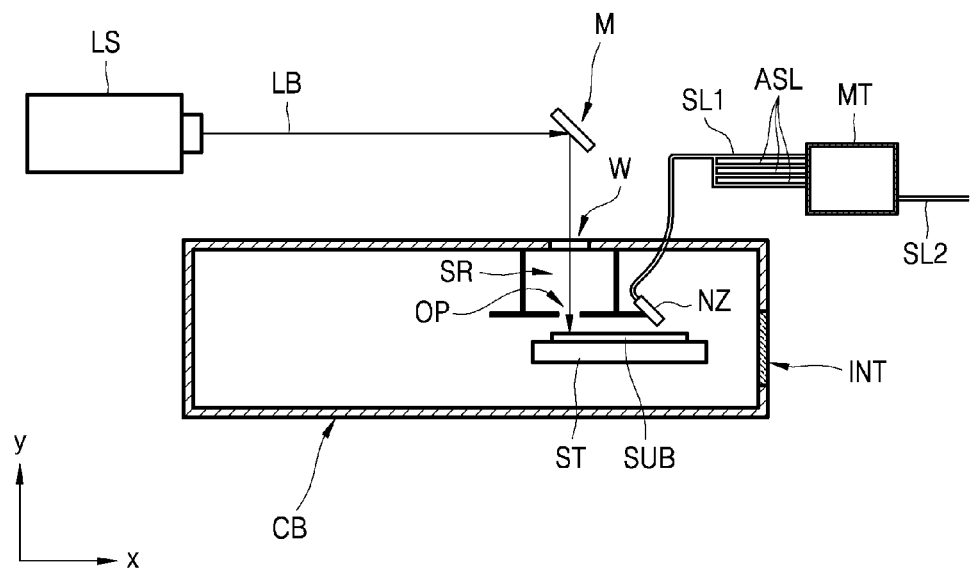
FIG. 4 is a schematic view of the laser annealing apparatus according to another exemplary embodiment.

FIG. 4 is a schematic view of the laser annealing apparatus according to another exemplary embodiment. The laser annealing apparatus according to another exemplary embodiment includes an additional supply line ASL divaricated from the first supply line SL1 at a portion of the first supply line SL1 between the first end and the second end thereof. The additional supply line ASL is connected to the surface of the middle tank MT, wherein the surface is located in the −x direction from the center of the middle tank. In FIG. 4, the laser annealing apparatus includes three additional supply lines ASL. In this case, using the first supply line SL1 and the additional supply lines ASL may have the same or similar effect as using the diffuser DF in FIG. 2.

Figure 5:
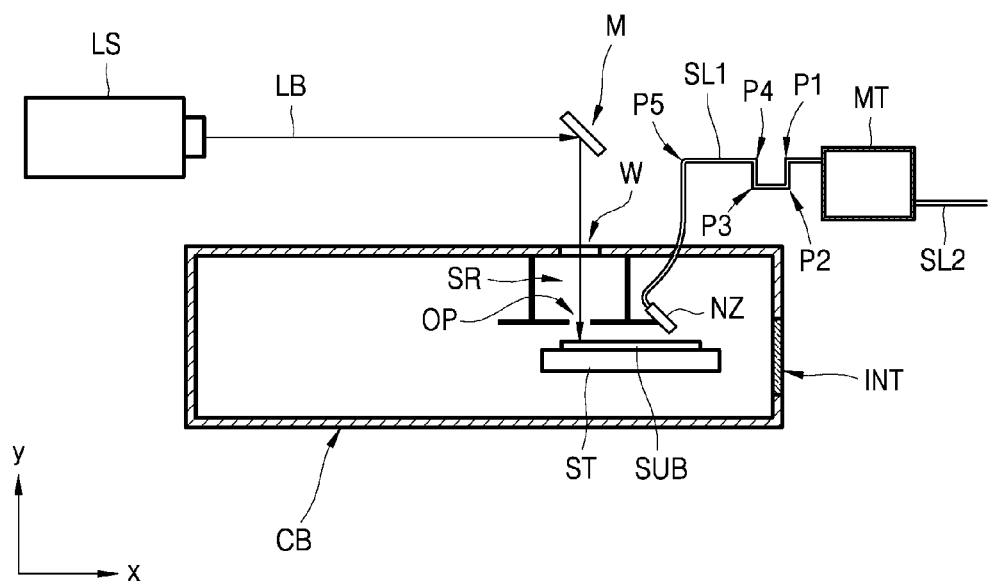
FIG. 5 is a schematic view of the laser annealing apparatus according to another exemplary embodiment.

FIG. 5 is a schematic view of the laser annealing apparatus according to another exemplary embodiment. In FIG. 1, the first supply line SL1 is bent one time, but in FIG. 5, the first supply line SL1 is bent five times. In FIG. 5, the first supply line SL1 has a first bent portion P1 to a fifth bent portion P5. The first supply line SL1 is bent more than one time, and thus, while the nitrogen gas flows through the first supply line SL1, even when the amount of the nitrogen gas changes in an area where the first supply line SL1 and the middle tank MT meet, the change may be moderated, thus reducing or minimizing any rapid change in the amount of the nitrogen gas discharged from the nozzle NZ.

Figure 6:
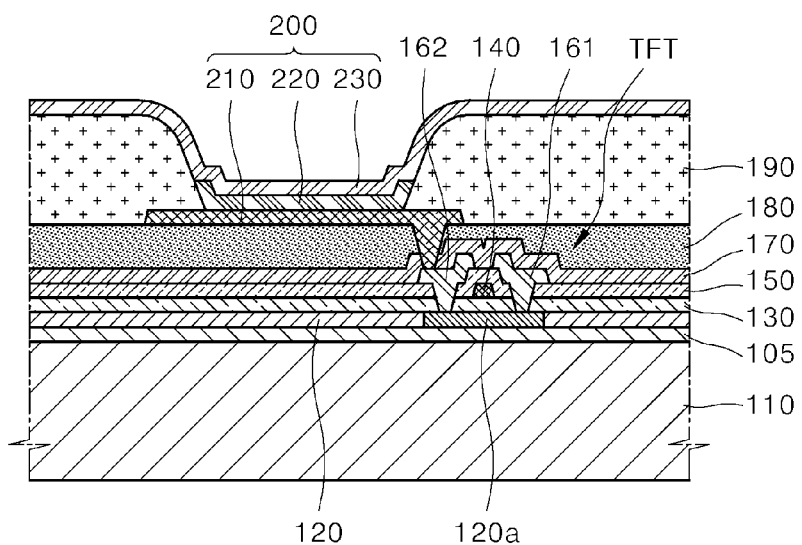
FIG. 6 is a schematic cross-sectional view of some portions of a display apparatus manufactured according to an exemplary embodiment.

The laser annealing apparatuses described above may be used to manufacture a display apparatus, and a method of manufacturing the display apparatus is also included in a scope of the inventive concept. FIG. 6 is a schematic cross-sectional view of an organic light-emitting display apparatus manufactured by the method.

When manufacturing the display apparatus, common layers including a buffer layer 105, a gate insulating layer 130, and an interlayer insulating layer 150 are formed on a whole surface of a substrate 110. A semiconductor layer including an amorphous silicon region 120 and a polycrystalline silicon region 120a is also formed on the whole surface of the substrate 110. The amorphous silicon layer is formed, and then may be crystallized by using the laser annealing apparatus described in FIGS. 1 to 5 to form the semiconductor layer. As necessary, the amorphous silicon region 120 may not be formed, and only the polycrystalline silicon region 120a may be formed. To this end, the amorphous silicon layer may be patterned after crystallization is complete for all parts thereof, or at least some portions of the polycrystalline silicon region may remain while others are removed. Then, a gate electrode 140, a source electrode 161 and a drain electrode 162 are formed.

Next, a protection layer 170 covering a thin film transistor TFT and a planarization layer 180 placed on the protection layer 170 and having a planar upper surface may be formed on the whole surface of the substrate 110. An organic light-emitting device 200 including a patterned pixel electrode 210, an opposite electrode 230 substantially corresponding to the whole surface of the substrate 110, and an intermediate layer 220, which is disposed between the pixel electrode 210 and the opposite electrode 230, and has a multi-layered structure including an emission layer is formed on the planarization layer 180. Some layers included in the intermediate layer 220 may be common layers substantially corresponding to the whole surface of the substrate 110, and some other layers may be patterned layers patterned to correspond to the pixel electrode 210, different from FIG. 6. The pixel electrode 210 may be electrically connected to the thin film transistor TFT through a via hole (or a via opening). The pixel defining layer 190 may include an opening for defining each pixel area and cover edges of the pixel electrode 210, and the pixel defining layer 190 may be formed on planarization layer 180 to substantially correspond to the whole surface of the substrate 110.

The organic light-emitting display apparatus manufactured herein may not have hillocks in the polycrystalline silicon region 120a, and even when the hillocks exit in the organic light-emitting display apparatus, the height of the hillocks may be reduced or minimized. In this regard, a defect rate during the manufacturing process for the organic light-emitting display apparatus may be sharply reduced.

The inventive concept is not limited to the organic light-emitting display apparatus and may be applied to a display apparatus having a thin film transistor that has a polycrystalline silicon layer as an active layer, for example, a liquid display apparatus.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. When an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

The laser annealing apparatus and/or any other relevant devices or components according to embodiments of the present invention described herein may be implemented utilizing any suitable hardware, firmware (e.g. an application-specific integrated circuit), software, or a suitable combination of software, firmware, and hardware. Further, the various components of the laser annealing apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While one or more exemplary embodiments have been described with reference to the figures, it will be understood by those of ordinary skill in the art that various changes in form and details may be made therein without departing from the spirit and scope as defined by the following claims and equivalents thereof.

What is claimed is:

1. A method of manufacturing a display apparatus, the method comprising:
    forming an amorphous silicon layer on a substrate;
    placing the substrate with the amorphous silicon layer in a chamber having a window on an upper portion thereof, and directing a laser beam toward the window; and
    converting the amorphous silicon layer into a polycrystalline silicon layer by irradiating the amorphous silicon layer with the laser beam while nitrogen gas is discharged from a nozzle located adjacent to an opening of a stabilizing room, wherein the laser beam reaches the amorphous silicon layer on the substrate after passing through the window, the stabilizing room, and the opening of the stabilizing room, wherein the opening faces the substrate,
    wherein a second end of a first supply line having a first end connected to the nozzle is connected to a first side of a middle tank, a second supply line is connected to a second side of the middle tank, and a part of the middle tank connected to the first supply line and an other part of the middle tank connected to the second supply line do not face each other, and
    wherein the nitrogen gas is discharged from the nozzle after passing through the second supply line, the middle tank, and the first supply line.

2. The method of claim 1, wherein the nitrogen gas is discharged from the nozzle after passing through an additional supply line, the additional supply line being divaricated from the first supply line at a portion of the first supply line between the first end and the second end, the additional supply line being connected to the first side of the middle tank.

3. The method of claim 1, wherein the nitrogen gas is discharged from the nozzle after passing through a diffuser between the first supply line and the middle tank.

4. The method of claim 1, wherein inside corners of the middle tank are rounded.

5. The method of claim 1, wherein the first supply line is bent one or more times.

* * * * *